United States Patent
Tailliet et al.

(10) Patent No.: US 10,559,575 B2
(45) Date of Patent: Feb. 11, 2020

(54) NON-VOLATILE MEMORY WITH RESTRICTED DIMENSIONS

(71) Applicant: STMicroelectronics (Rousset) SAS, Rousset (FR)

(72) Inventors: François Tailliet, Fuveau (FR); Marc Battista, Allauch (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/057,193

(22) Filed: Aug. 7, 2018

(65) Prior Publication Data

US 2019/0067307 A1 Feb. 28, 2019

(30) Foreign Application Priority Data

Aug. 28, 2017 (FR) .................... 17 57908

(51) Int. Cl.
| | |
|---|---|
| *G11C 16/04* | (2006.01) |
| *H01L 27/11526* | (2017.01) |
| *G11C 16/06* | (2006.01) |
| *H01L 27/11524* | (2017.01) |
| *H01L 27/11529* | (2017.01) |
| *G11C 5/02* | (2006.01) |
| *G11C 16/10* | (2006.01) |
| *G11C 16/14* | (2006.01) |

(52) U.S. Cl.
CPC ........ *H01L 27/11526* (2013.01); *G11C 5/025* (2013.01); *G11C 16/0433* (2013.01); *G11C 16/06* (2013.01); *G11C 16/10* (2013.01); *G11C 16/14* (2013.01); *H01L 27/11524* (2013.01); *H01L 27/11529* (2013.01)

(58) Field of Classification Search
CPC ........ H01L 27/11526; H01L 27/11529; H01L 27/11524; G11C 16/14; G11C 16/10; G11C 16/0433; G11C 16/06; G11C 5/025; G11C 16/02
USPC .................................................. 365/185.12
See application file for complete search history.

(56) References Cited

U.S. PATENT DOCUMENTS

| 7,006,381 | B2 * | 2/2006 | Dormans ........... | G11C 16/0433 |
| | | | | 257/E27.103 |
| 8,462,553 | B2 * | 6/2013 | Lee .................... | G11C 16/0433 |
| | | | | 365/185.2 |
| 2005/0185501 | A1 * | 8/2005 | Lee .................... | G11C 16/0408 |
| | | | | 365/238.5 |

(Continued)

*Primary Examiner* — Tha-O H Bui
(74) *Attorney, Agent, or Firm* — Slater Matsil, LLP

(57) ABSTRACT

A memory device includes a memory plane including a succession of neighboring semiconductor recesses of a first type of conductivity, wherein each semiconductor recess houses a plurality of memory words including a plurality of memory cells, wherein each memory cell includes a state transistor having a floating gate and a control gate. The memory device further includes a plurality of control gate selection transistors respectively allocated to each memory word of the plurality of memory words, wherein each control gate selection transistor is coupled to the control gates of the state transistors of the memory word to which the control gate selection transistor is allocated, wherein each control gate selection transistor is situated in and on a neighbor semiconductor recess of the semiconductor recess housing the memory word to which the control gate selection transistor is allocated.

20 Claims, 5 Drawing Sheets

(56) References Cited

U.S. PATENT DOCUMENTS

2005/0195636 A1 9/2005 Umezawa et al.
2008/0080244 A1 4/2008 Lee et al.
2013/0229875 A1 9/2013 La Rosa et al.

* cited by examiner

| WL | COL | CGL | WL | B0 | B1 | CG | BL | S0 | S1 |
|---|---|---|---|---|---|---|---|---|---|
| Non sel | Non sel | 6 | 3 | 3 | 0 | 3 | 6 | 9 | 0 |
| Non sel | Sel BL=0 | | | | | 0 | 15 | | |
| Non sel | Sel BL=1 | | | | | | | | |
| Sel | Non sel | | 18 | | | 3 | 6 | | |
| Sel | Sel BL=0 | | | | | 0 | 15 | | |
| Sel | Sel BL=1 | | | | | | | | |

EF (EP)

| WL | COL | CGL | WL | B0 | B1 | CG | BL | S0 | S1 |
|---|---|---|---|---|---|---|---|---|---|
| Non sel | Non sel | 3 | 0 or 6 | 0 | 3 | 6 | float | 0 | 3 |
| Non sel | Sel BL=0 | | | | | 15 | | | |
| Non sel | Sel BL=1 | | | | | | | | |
| Sel | Non sel | 18 | | | | 6 | | | |
| Sel | Sel BL=0 | | | | | 15 | | | |
| Sel | Sel BL=1 | | | | | | | | |

Table 1

NON-VOLATILE MEMORY WITH RESTRICTED DIMENSIONS

CROSS-REFERENCE TO RELATED APPLICATIONS

This application claims priority to French Patent Application No. 1757908, filed on Aug. 28, 2017, which application is hereby incorporated herein by reference.

TECHNICAL FIELD

Embodiments relate to memories, especially non-volatile memories, and in particular embodiments to non-volatile memory with restricted (e.g. compact) dimensions.

BACKGROUND

Customarily in EEPROM memory devices, a memory cell includes a state transistor intended to store an item of information. The state transistor includes a control gate and a floating gate, in series with an access transistor, or bit line selection transistor. The access transistor is controlled by a word line signal and makes it possible to access the state transistor electrically, in particular in order to read an item of data therefrom or write an item of data thereto.

Control gate selection transistors are connected between gate control lines and the control gates of the state transistors of a memory word. The control gate selection transistors are controlled by a dedicated control signal and make it possible to access the memory cells electrically, in particular in order to read an item of data therefrom or write an item of data thereto.

The voltages implemented in the course of data writes, generally including an erasure cycle and a programming cycle, must be high enough to inject or extract a charge of the floating gate of the state transistors through the Fowler-Nordheim effect.

However, the access transistors and control gate selection transistors intrinsically exhibit voltage limits beyond which they risk breakdowns, such as avalanches of the source-substrate or drain-substrate junctions, and premature wear.

These physical limits stem in particular from the densification of the arrangement of electronic components and the reduction in their sizes.

A consequence of the reduction in the size of components such as the access transistors and control gate selection transistors of integrated memory circuits is that they are no longer capable of transmitting the high voltages required for writing data.

Indeed, during an erasure cycle, high erasure voltages of 14V to 15V are applied to the control gates of the state transistors of the memory words. A memory word includes in a customary manner a group of memory cells, for example an octet or byte.

These high erasure voltages are transmitted through a control gate selection transistor having a breakdown voltage of its source-substrate or drain-substrate junction of the order of 12V.

During a programming cycle, high programming voltages of 14V to 15V are transmitted to the state transistor of a memory cell via the access transistor.

Likewise, the access transistors have a breakdown voltage of their source-substrate or drain-substrate junctions of the order of 12V.

The solutions involving maximizing the coupling factor of the floating gates and decreasing the tunnel oxide thickness reduce endurance and data retention performance, and have furthermore reached their technological limits (with coupling factors exceeding 80% and tunnel oxide thicknesses of less than 7 nm).

The solution involving increasing the write time is not effective and is opposed to the objectives of raising memory speeds.

The split voltage solution involves, briefly, applying combinations of negative and positive potentials so as to reach the high voltages required without however exceeding the breakdown voltages of the components.

That said, the split voltage technologies require in particular two charge pumps (one generating a negative potential and the other a positive potential), each using a substantial and relatively significant surface area at the periphery of the memory plane of the memory.

However, it is desirable to limit the use of the surface area of semiconductor substrates which support integrated circuits, thus the split voltage solution may be unsuitable, for example for low-density memories, comprising an already small memory plane which therefore cannot accept a large surface area at the periphery.

SUMMARY

According to one embodiment, a device includes electrically conducting tracks coupling each control gate selection transistor to control gates of state transistors of a memory word to which it is allocated, each conducting track passing above at least one control gate selection transistor produced in a recess housing the memory word.

According to one embodiment, the control gate selection transistors are, in each recess, grouped together in groups of N control gate selection transistors and are respectively allocated to N memory words belonging to one and the same recess, N being a whole number, for example N=4.

According to one embodiment, the succession of recesses includes an alternation of first recesses and of second recesses, the first recesses being electrically mutually coupled and the second recesses being electrically mutually coupled.

According to one embodiment, the memory words are arranged in rows and columns in the memory plane, half the memory words of one and the same row forming an even page and the other half of the memory words of this row forming an odd page, in which the even pages are produced in the first recesses and the odd pages are produced in the second recesses, the memory being accessible page-wise.

Advantageously, the device includes an erasure circuit configured to erase the memory cells of a selected memory word by applying an erasure voltage on the control gates of the state transistors of the memory cells of the selected memory word, via the conduction terminals of the control gate selection transistor allocated to the selected memory word, and by applying, in the recess containing the control gate selection transistor, a first compensation voltage adapted to prevent junction breakdown between the control gate selection transistor and the recess which contains it.

For example, the erasure circuit is configured to apply the high erasure voltage equal to substantially 15 volts and the first compensation voltage equal to substantially 3 volts.

According to one embodiment in which each memory cell includes an access transistor coupled in series with the state transistor of the memory cell, the device includes a programming circuit configured to program a selected memory cell belonging to a selected memory word, by applying a programming voltage to the conduction terminals of the access transistor of the selected memory cell, and by applying, in the recess containing the selected memory word, a second compensation voltage adapted to prevent junction breakdown between the access transistor and the recess which contains it.

For example, the programming circuit is configured to apply the high programming voltage equal to substantially 15 volts and the second compensation voltage equal to substantially 3 volts.

BRIEF DESCRIPTION OF THE DRAWINGS

Other advantages and characteristics of the invention will be apparent on examining the detailed description of wholly non-limiting embodiments and modes of implementation and the appended drawings in which:

FIGS. 1 to 6 illustrate examples of embodiments and of modes of implementation of the invention.

DETAILED DESCRIPTION OF ILLUSTRATIVE EMBODIMENTS

There is proposed a solution making it possible to solve the voltage limitations of components, while reducing the surface area consumed, both in a memory plane and at a periphery.

There is thus proposed in this regard a memory device, of the electrically erasable and programmable non-volatile memory type, including a memory plane including a succession of electrically mutually insulated neighbor semiconductor recesses of a first type of conductivity, each recess housing memory words possessing memory cells, each including a state transistor having a floating gate and a control gate, and respective control gate selection transistors allocated to each memory word, each control gate selection transistor being coupled to the control gates of the state transistors of the memory word to which it is allocated, each control gate selection transistor being situated in and on a neighbor semiconductor recess of the semiconductor recess housing the memory word to which it is allocated.

Thus, it is possible to increase the potential of the recess including the control gate selection transistor so as not to exceed its breakdown voltage, without biasing the voltages present in the recess including the memory word, and without needing to produce recesses dedicated to the control gate selection transistors. That said, the proposed device is compatible with the split voltage techniques.

For example the device includes semiconductor wells of a second type of conductivity opposite to the first type of conductivity and configured to laterally insulate two neighbor recesses and a semiconductor buried layer of the second type of conductivity configured to vertically insulate each recess from the remainder of a semiconductor subjacent substrate of the first type of conductivity.

Figure 1:
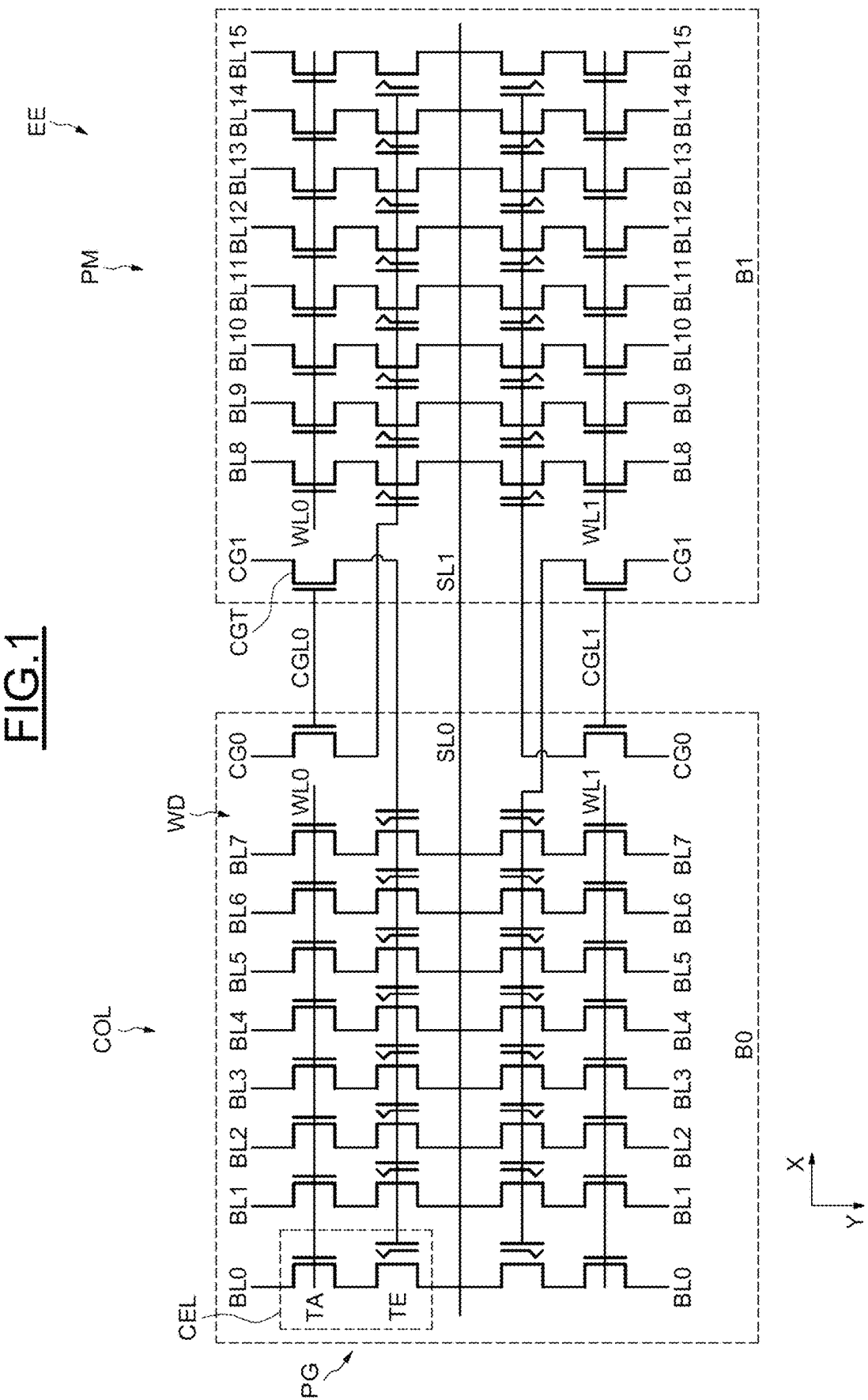

FIG. 1 represents a part of a memory plane PM of a non-volatile memory of the electrically erasable and programmable type EE formed in and on a semiconductor substrate of a first type of conductivity.

The memory plane PM includes memory cells CEL, each including an access transistor TA and a state transistor TE having a floating gate and a control gate.

The memory cells are grouped into memory words WD, each memory word WD including, for example, eight memory cells.

Each memory word WD belongs to a column COL and to a row RG organizing the memory plane PM in matrix fashion. The columns follow one another in a first direction X of the memory plane PM and the rows follow one another in a second direction Y of the memory plane PM.

In this example, half the memory words belonging to one and the same row RG form a page. A row can include an even page and an odd page.

A page represents for example the largest quantity of data that can be written by the memory in a single write cycle. The memory is then said to be accessible page-wise.

A memory cell is accessible via respective bit lines BL (shown as BL0-BL15 in FIG. 1), each being coupled to the drain of the access transistor TA of the respective cell.

The access transistors TA are controlled on their gates by a word line signal applied to a word line WL which is common to all the memory cells CEL of one and the same row RG.

The state transistors TE are for their part controlled by a control signal CG applied to their control gates. The control signal CG is applied to the control gates of all the state transistors of a memory word via the conduction terminals of a control gate selection transistor CGT allocated to each memory word WD.

The control gate selection transistors CGT of one and the same row are controlled on their gates by one and the same signal dedicated to the control gate selection transistors and transmitted by a control line CGL.

The sources of the state transistors TE are linked to a source line SL, common to all the memory cells situated in one and the same recess of the memory plane PM.

In this example, a succession of neighbor semiconductor recesses B0, B1 of the memory plane is represented.

The first recess B0 of the first type of conductivity, for example type P (otherwise referred to as p-type), the second recess B1 is also of the first type of conductivity.

As will be seen hereinafter in conjunction with FIG. 3 in particular, the first recess B0 and the second recess B1 are electrically insulated from one another and from the remainder of the substrate, by a single semiconductor well of a second type of conductivity opposite to the first type of conductivity, for example type N (otherwise referred to as n-type).

As will be seen hereinafter in particular in conjunction with FIG. 2, an alternation of first recesses B0 and of second recesses B1 of the same type of conductivity in the succession of recesses allows optimization of the quantity of surface area occupied by the control and decoding elements (not represented in the figures) situated at the periphery of the memory plane.

The control gate selection transistors CGT allocated to the memory words WD produced in and on the first recess B0 are produced in and on the second recess B1.

The control gate selection transistors CGT allocated to the memory words WD produced in and on the second recess B1 are produced in and on the first recess B0.

In practice, the memory plane includes a succession of numerous first recesses B0 and second recesses B1 which are neighbors in alternation. All the first recesses B0 are electrically coupled; likewise, all the second recesses B1 are electrically coupled. Each control gate selection transistor CGT allocated to the memory words produced in the first recesses B0 is produced in one of the two second recesses B1 which are neighbors of the respective first recess B0; likewise, each control gate selection transistor CGT allocated to the memory words produced in the second recesses B1 is produced in one of the two first recesses B0 which are neighbors of the respective second recess B1.

To summarize, the memory includes a memory plane PM includes a succession of semiconductor recesses of a first type of conductivity B0, B1 which are neighbors and electrically insulated from one another. Each recess B0, B1 houses memory words WD, and control gate selection transistors CGT respectively allocated to each memory word WD, each control gate selection transistor CGT being coupled to the control gates of the state transistors TE of the memory word to which it is allocated, the control gate selection transistors CGT being situated in and on a neighbor semiconductor recess B1, B0 of the semiconductor recess B0, B1 housing the memory word WD to which it is allocated.

Figure 2:
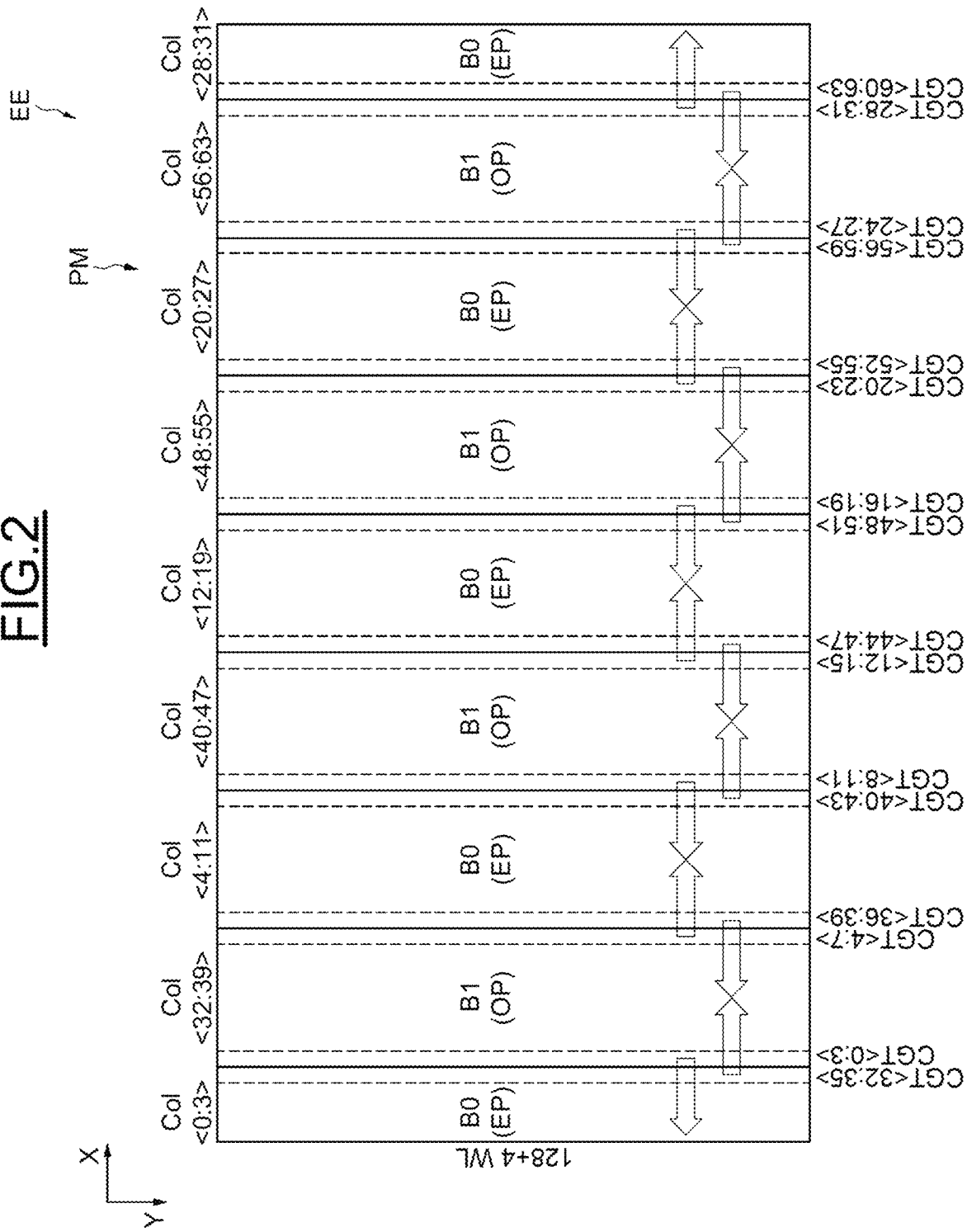

FIG. 2 represents an exemplary memory plane PM of a 64K non-volatile memory EE of the type of that described above.

The memory plane PM includes, in this example, four first recesses B0, considering that the two half-recesses situated at the lateral ends (along the first direction X, that is to say, in the figure, at the left and right ends of the memory plane) form a single recess.

The memory plane PM also includes, in this example, four first recesses B1.

The succession of recesses includes an alternation of first recesses B0 and of second recesses B1, the first recesses B0 being electrically mutually coupled and the second recesses B1 being electrically mutually coupled.

Thus, each first recess B0 is a neighbor in the memory plane PM of two second recesses B1 and each second recess B1 is a neighbor in the memory plane PM of two first recesses B0 (except for the recesses situated at the ends of the memory plane PM).

This organization makes it possible to dispose half the pages, the so-called even pages EP, in a manner interleaved with the other half of the pages, the so-called odd pages OP, in the hardware disposition of the memory plane.

Indeed, the parity of the pages is considered in the sense of their logical organization, termed the "arrangement in the memory plane", in particular in that they are always consecutive to one another in the arrangement of the memory plane (that is to say that the page following or preceding an even page is an odd page, and the page following or preceding an odd page is an even page).

In this example each recess includes 8 memory words WD and therefore according to an arrangement in the memory plane PM of 8 columns per recess.

Thus, columns Col0 to Col31 (i.e. Col<0:3>, Col<4:11>, Col<12:19>, Col<20:27>, Col<28:31>) are formed in the first recesses B0, the intersection of a row WL with these 32 consecutive columns forms an even page EP.

Likewise, columns Col32 to Col63 (i.e. Col<32:39>, Col<40:47>, Col<48:55>, Col<56:63>) are formed in the second recesses B1, the intersection of a row WL with these 32 consecutive columns forms an odd page OP.

In this exemplary 64K EEPROM memory, the memory plane is thus arranged according to 64 columns (Col<0:63>) and 128 rows (WL). Four additional rows are furthermore disposed on the edges (in the second direction Y) of the memory plane PM but are electrically unused. These "dummy" additional rows make it possible to avoid undesirable edge effects in the electrically active rows.

This criss-cross organization of the even pages EP and of the odd pages OP makes it possible to halve the number of physical rows of the memory plane PM (in the second direction Y), by disposing them in a criss-cross fashion in the arrangement of the columns (in the first direction X).

Thus, on the one hand, the size of the row decoder is halved, and on the other hand, the size of the column decoder is also reduced along the second direction Y.

Indeed, the column decoder, essentially including bit line latches and making it possible to access each bit line, is advantageously demultiplexed towards the columns of the even rows or towards the columns of the odd rows. This organization, offering twice as much space in the first direction X to dispose as many bit line latches, makes it possible to correspondingly reduce the footprint of the decoder of columns in the second direction Y. The footprint of the demultiplexing circuit is moreover regarded as negligible with respect to the column decoder.

For example, in a customary architecture of 32 physical columns and 256 physical rows, a physical row comprising a page of 32 columns, the memory requires 8×32=256 bit line latches disposed in the length of 32 physical columns in the first direction X, and 256 row decoders in the second direction Y; while in the example of this organization of 64 physical columns and 128 physical rows, a physical row comprising 2 pages of 32 columns, the memory requires 8×32=256 demultiplexed bit line latches disposed in the length of 64 physical columns in the first direction X, and 128 row decoders in the second direction Y.

Stated otherwise, there has been described a memory device EE in which the memory words WD are arranged in rows and columns in the memory plane PM, the memory words WD of one and the same row forming a page EP, OP, and in which even pages EP are produced in the first recesses B0 and odd pages OP are produced in the second recesses B1, the memory being accessible page-wise.

Thus, writing three entire and consecutive pages (beginning for example with an even page EP) comprises an access to a first row WLi and to columns Col0 to Col31 in their respective first recesses B0, followed by an access to the same first row WLi and to columns Col31 to Col63 in their respective second recesses, followed by an access to a second row WLi+1 and to columns Col0 to Col31 in their respective first recesses B0.

The control gate selection transistors CGT<0:3> and CGT<28:31> allocated to the memory words of the columns Col<0:3> and Col<28:31> of the first recess B0 are formed in the neighbor second recesses B1 comprising respectively the columns Col<32:39> and Col<56:63>; the control gate selection transistors CGT<4:7> and CGT<8:11> allocated to the memory words of the columns Col<4:11> of the first recess B0 are formed in the neighbor second recesses B1 comprising respectively the columns Col<32:39> and Col<40:47>; the control gate selection transistors CGT<12:15> and CGT<16:19> allocated to the memory words of the columns Col<12:19> of the first recess B0 are formed in the neighbor second recesses B1 comprising respectively the columns Col<40:47> and Col<48:55>; the control gate selection transistors CGT<20:23> and CGT<24:27> allocated to the memory words of the columns Col<20:27> of the first recess B0 are formed in the neighbor second recesses B1 comprising respectively the columns Col<48:55> and Col<56:63>; the control gate selection transistors CGT<32:35> and CGT<36:39> allocated to the memory words of the columns Col<32:39> of the second recess B1 are formed in the neighbor first recesses B0 comprising respectively the columns Col<0:3> and Col<4:11>; the control gate selection transistors CGT<40:43> and CGT<44:47> allocated to the memory words of the columns Col<40:47> of the second recess B1 are formed in the neighbor first recesses B0 comprising respectively the columns Col<4:11> and Col<12:19>; the control gate selection transistors CGT<48:51> and CGT<52:55> allocated to the memory words of the columns Col<48:55> of the second recess B1 are formed in the neighbor first recesses B0 comprising respectively the columns Col<12:19> and Col<20:27>; the control gate selection transistors CGT<56:59> and CGT<60:63> allocated to the memory words of the columns Col<56:63> of the second recess B1 are formed in the neighbor first recesses B0 comprising respectively the columns Col<20:27> and Col<28:31>.

The control gate selection transistors CGT<i:j> are formed on the lateral periphery (along the first direction X) of their respective recess, that is to say as close as possible to the neighbor recess comprising the memory word to which they are allocated.

Thus, in the course of one and the same write cycle, it is possible to use all the control gate selection transistors CGT situated in the second recesses B1 and allocated to the memory words WD of an even page EP which are situated in the first recesses B0, or to use all the control gate selection transistors CGT situated in the first recesses B0 and allocated to the memory words WD of an odd page OP which are situated in the second recesses B1.

Figure 3:
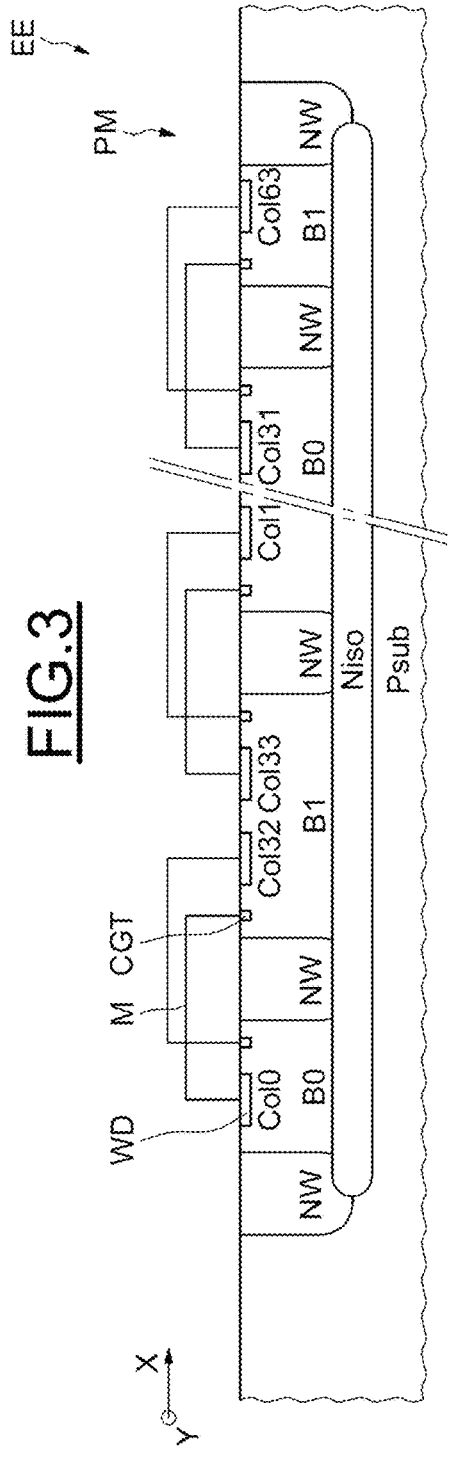

FIG. 3 represents a sectional view of the example described previously in conjunction with FIG. 1.

In this example, two neighbor recesses B0, B1 of the memory plane are represented.

The first recess B0 and the second recess B1 are of the first type of conductivity, here type P.

A first recess B0 and a second recess B1 are electrically insulated laterally (that is to say along the first direction X) by a single semiconductor well NW of a second type of conductivity opposite to the first type of conductivity, here type N.

The first recesses B0 and the second recesses B1 are furthermore electrically insulated from the remainder of the substrate Psub of the first type of conductivity by a buried semiconductor layer Niso of the second type of conductivity and of lateral semiconductor wells NW. The lateral semiconductor wells surround the memory plane PM and are of the same nature as the semiconductor wells NW insulating two neighbor recesses.

Each control gate selection transistor CGT is electrically coupled to the control gates of the state transistors TE of the memory word WD to which it is allocated by an electrically conducting track M passing above at least one control gate selection transistor CGT produced in the recess housing the memory word WD.

Advantageously, each control gate selection transistor CGT is situated on the lateral periphery of its respective recess, that is to say between the memory words housed in this recess and the insulating semiconductor well NW.

Figure 4:
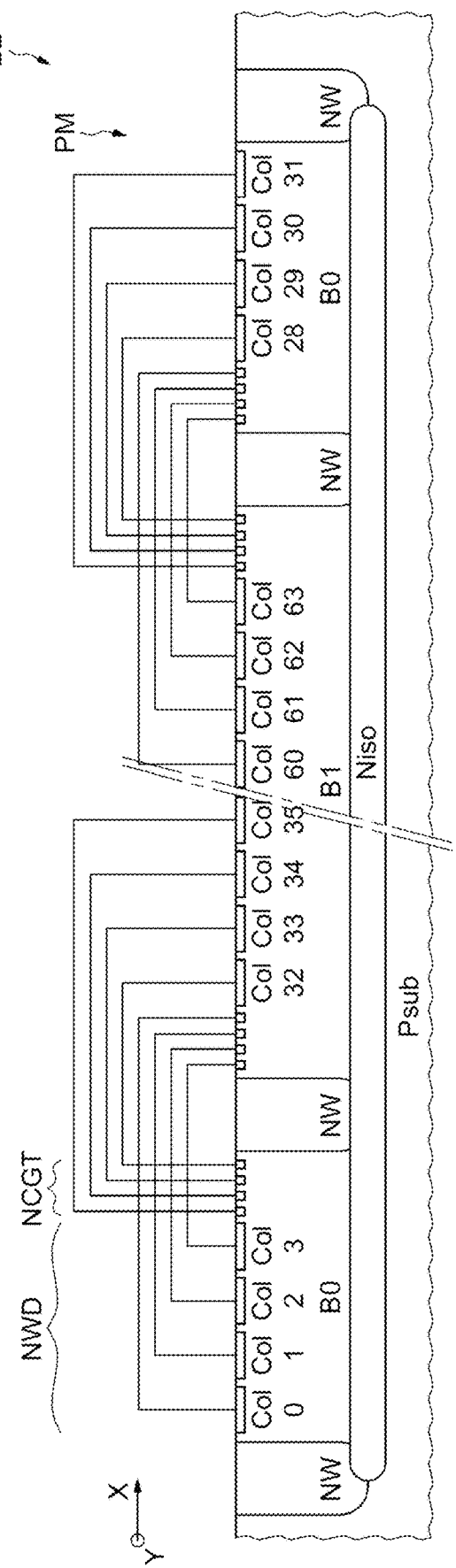

FIG. 4 represents a sectional view of the example described previously in conjunction with FIG. 2.

In this example, the control gate selection transistors CGT are, in each recess B0, B1, grouped together in groups of N control gate selection transistors NCGT and are respectively allocated to N memory words NWD housed in one and the same neighbor recess, with N a whole number, for example 4.

Hereinafter, a group of N elements, such as transistors or conducting tracks, is designated by the term "N-tuple".

Advantageously, the N-tuples of control gate selection transistors NCGT are situated on the lateral periphery of their respective recess, that is to say that they are produced between the memory words of this recess and the insulating semiconductor wells NW.

The N memory words NWD are advantageously arranged consecutively in the arrangement of the memory plane PM.

Each N-tuple of electrically conducting tracks, coupling respectively the control gate selection transistors CGT of an N-tuple NCGT to the N memory words NWD to which they are respectively allocated, thus pass above the N control gate selection transistors of the N-tuple situated in the neighbor recess.

The value N is essentially related to the interconnections that have to cross one another. The more interconnection levels there are in the integrated circuit, and/or the smaller the spacing of the interconnections (the spacing of the interconnections corresponds to the width of a metallic track and the distance between two adjacent tracks), the larger will be the number N of metallic tracks and therefore of control gate selection transistors CGT that can be grouped together in a recess.

FIG. 5 represents two tables EF(EP), PG(EP) of values in volts of the voltages to be applied to the selected or non-selected memory cells of the memory plane PM. These voltage values make it possible to implement in a preferential manner an erasure EF(EP) or a programming EF(EP), in the example of an even page EP of a memory such as described previously in conjunction with FIGS. 1 to 4.

In detail the tables comprise the voltages to be applied to the control lines CGL dedicated to the control gate selection transistors, to the word lines WL, to the first recesses B0, to the second recesses B1, to the control gates CG, to the bit lines BL, to the first source lines SL0 and to the second source lines SL1; as a function of the selection or non-selection of the row WL(Sel), WL(Non sel) and of the non-selection of the COL column(Non sel) or, in case of selection of the column, of the selection of the bit line COL(Sel BL=1), or non COL(Sel BL=0).

The various voltage values advantageously make it possible to apply, in particular, high erasure voltages of 15V to the control gates of the state transistors of the memory cells of a selected memory word, and high programming voltages of 15V to the drain region of a state transistor of a selected memory cell, while complying jointly with a breakdown constraint, a gate voltage constraint, and a non-selected memory cells disturbance constraint.

The breakdown constraint corresponds to maintaining, in the transistors of the memory plane, a voltage of less than 12V between the source and the recess or between the drain and the recess. This makes it possible to avoid breakdowns of the PN junctions of the transistors.

The gate voltage constraint corresponds to maintaining, in the transistors of the memory plane, a voltage of less than 12V between the gate and the channel region. This makes it possible to avoid premature wear of the transistors.

The non-selected memory cells disturbance constraint corresponds to maintaining, in the state transistors of non-selected memory cells, a voltage of less than 3V between the control gate and the source or drain region. This makes it possible to avoid losses of charge of the floating gates during the writing of another memory cell.

It is recalled that the examples of values presented apply to a write in an even page EP, that is to say whose memory cells belong to a first recess B0.

During erasure EF(EP), a high erasure voltage CGT of 15V is transmitted via the conduction terminals CG of the control gate selection transistor (e.g. by an erasure circuit), thus in order to comply with the breakdown constraint, a first breakdown compensation voltage of 3V is applied in the second recess B1.

This erasure voltage of 15V being applied to a conduction terminal of all the control gate selection transistors of the selected column, a gate voltage compensation voltage of 3V is applied to the gates of the non-selected control gate selection transistors.

To transmit the erasure voltage of 15V, a voltage of 18V is applied to the gates CGL of the control gate selection transistors belonging to the same row, thus, in order to comply with the gate voltage constraint, a gate voltage compensation voltage of 6V is applied in the channel regions of the non-selected control gate selection transistors.

Consequently this voltage of 6V is transmitted to the control gates of state transistors of the non-selected memory words of the same row, thus, in order to comply with the non-selected memory cells disturbance constraint, a disturbance compensation voltage of 3V is applied to the second source line S1.

During programming PG(EP), a high programming voltage BL of 15V is transmitted via the conduction terminals of the state transistor of the cells of the selected bit line (e.g. by a programming circuit), thus in order to comply with the breakdown constraint, a second breakdown compensation voltage of 3V is applied in the first recess B0.

In order to transmit the programming voltage of 15V, a voltage of 18V is applied to the gates WL of the access transistors belonging to the same row, thus, in order to comply with the gate voltage constraint, a gate voltage compensation voltage of 6V is applied in the channel regions of the other access transistors of the row.

Consequently this voltage of 6V is transmitted to the drain regions of the state transistors of the non-selected memory cells of the same row, thus, in order to comply with the non-selected memory cells disturbance constraint, a disturbance compensation voltage of 3V is applied to the gates of the state transistors.

This disturbance compensation voltage of 3V is transmitted by the respective control gate selection transistors by a voltage of 6V applied to their gates CGL.

Furthermore, the voltage of 9V of the first source line S0 during programming corresponds to a precharging making it possible to avoid an undesirable current flow in the cell while programming.

Moreover, the embodiments described previously in conjunction with FIGS. 1 to 4 are compatible with split voltage technologies. Indeed, there may be advantages in making joint use of a split voltage technique in the devices presented and described previously.

For example, in order to be generated, the voltages of 18V may necessitate particular technologies, such as charge pumps or various switching circuitry.

For example, certain methods of fabrication produce transistors the most tolerant of which cannot withstand more than 16V.

Thus, lowering by 3V all the voltages mentioned in the tables of FIG. 5 makes it possible to respond to these examples of limitations, the maximum voltage to be applied thus decreasing to 15V, while negative voltages of −3V are introduced.

Generating −3V may or may not be simpler than generating 18V, this depends on the technological environment of the integrated circuit integrating the memory EE.

Figure 6:
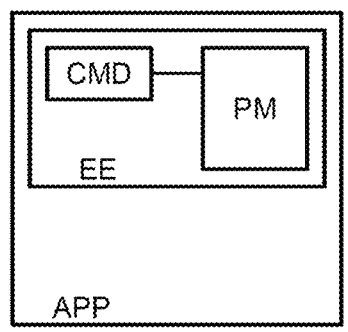

FIG. 6 represents a non-volatile memory EE such as described previously in conjunction with FIGS. 1 to 5, including the memory plane PM and writing circuit CMD including an erasure circuit and a programming circuit respectively configured to implement erasures and programmings such as described previously in conjunction with FIG. 5.

In this example, the memory EE is incorporated into an electronic apparatus APP, such as for example a mobile telephone or a tablet. It will be apparent to the person skilled in the art that the embodiments of a memory such as were detailed previously can be included in any other known product not described here.

Moreover, the invention is not limited to these embodiments but embraces all variants thereof, for example, the 64K density of the memory described hereinabove in conjunction with FIG. 2 was given by way of example, in particular since it is appropriate to its representation.

What is claimed is:

1. A memory device, comprising:
a memory plane comprising a succession of neighboring semiconductor recesses of a first type of conductivity, wherein each semiconductor recess houses a plurality of memory words comprising a plurality of memory cells, wherein each memory cell comprises a state transistor having a floating gate and a control gate; and
a plurality of control gate selection transistors respectively allocated to each memory word of the plurality of memory words, wherein each control gate selection transistor is coupled to the control gates of the state transistors of the memory word to which the control gate selection transistor is allocated, wherein each control gate selection transistor is situated in and on a neighbor semiconductor recess of the semiconductor recess housing the memory word to which the control gate selection transistor is allocated.

2. The memory device according to claim 1, wherein the memory device comprises an electrically erasable and programmable non-volatile memory.

3. The memory device according to claim 1, wherein the succession of neighboring semiconductor recesses comprises mutually insulated neighboring semiconductor recesses of the first type of conductivity.

4. The memory device according to claim 1, further comprising electrically conducting tracks coupling each control gate selection transistor to the control gates of the state transistors of the memory word to which the control gate selection transistor is allocated.

5. The memory device according to claim 4, wherein each conducting track passes above at least one control gate selection transistor produced in the semiconductor recess housing the memory word.

6. The memory device according to claim 1, wherein the control gate selection transistors are, in each semiconductor recess, grouped together in groups of N control gate selection transistors and are respectively allocated to N memory words belonging to one and the same semiconductor recess.

7. The memory device according to claim 1, wherein the succession of neighboring semiconductor recesses comprises an alternation of first recesses and second recesses, the first recesses being electrically mutually coupled and the second recesses being electrically mutually coupled.

8. The memory device according to claim 7, wherein the memory words are arranged in rows and columns in the memory plane, wherein half the memory words of one and the same row form an even page and an other half of the memory words of the one and the same row forms an odd page, wherein the even pages are produced in the first recesses and the odd pages are produced in the second recesses, and wherein the memory device is accessible page-wise.

9. The memory device according to claim 1, further comprising an erasure circuit configured to erase memory cells of a selected memory word by applying an erasure voltage to the control gates of the state transistors of the memory cells of the selected memory word, via conduction terminals of the control gate selection transistor allocated to the selected memory word, and by applying, in the semiconductor recess containing the control gate selection transistor, a first compensation voltage adapted to prevent junction breakdown between the control gate selection transistor and the recess which contains the control gate selection transistor.

10. The memory device according to claim 1, wherein each memory cell comprises an access transistor coupled in series with the state transistor of the memory cell, the memory device further comprising a programming circuit configured to program a selected memory cell belonging to a selected memory word, by applying a programming voltage to conduction terminals of the access transistor of the selected memory cell, and by applying, in the semiconductor recess containing the selected memory word, a second compensation voltage adapted to prevent junction breakdown between the access transistor and the recess which contains the selected memory word.

11. A memory device comprising:
  a memory plane comprising a succession of neighboring semiconductor recesses of a first type of conductivity, wherein each semiconductor recess houses a plurality of memory words comprising a plurality of memory cells, wherein each memory cell comprises a state transistor having a floating gate and a control gate;
  a plurality of control gate selection transistors respectively allocated to each memory word of the plurality of memory words, wherein each control gate selection transistor is coupled to the control gates of the state transistors of the memory word to which the control gate selection transistor is allocated, wherein each control gate selection transistor is situated in and on a neighbor semiconductor recess of the semiconductor recess housing the memory word to which the control gate selection transistor is allocated; and
  semiconductor wells of a second type of conductivity opposite to the first type of conductivity and configured to laterally insulate immediately neighboring semiconductor recesses.

12. The memory device according to claim 11, further comprising a semiconductor buried layer of the second type of conductivity configured to vertically insulate each semiconductor recess from a remainder of a semiconductor subjacent substrate of the first type of conductivity.

13. An apparatus, comprising:
  a memory device, the memory device comprising:
    a memory plane comprising neighboring semiconductor recesses of a first type of conductivity, wherein each semiconductor recess houses a plurality of memory words comprising a plurality of memory cells, wherein each memory cell comprises a state transistor having a floating gate and a control gate;
    a plurality of control gate selection transistors respectively allocated to each memory word of the plurality of memory words, wherein each control gate selection transistor is coupled to the control gates of the state transistors of the memory word to which the control gate selection transistor is allocated, wherein each control gate selection transistor is situated in and on a neighbor semiconductor recess of the semiconductor recess housing the memory word to which the control gate selection transistor is allocated; and
    semiconductor wells of a second type of conductivity opposite to the first type of conductivity and configured to laterally insulate immediately neighboring semiconductor recesses, wherein the memory device comprises an electrically erasable and programmable non-volatile memory.

14. The apparatus according to claim 13, wherein the apparatus comprises a mobile telephone or an auditory prosthesis device.

15. The apparatus according to claim 13, wherein the memory device further comprises a semiconductor buried layer of the second type of conductivity configured to vertically insulate each semiconductor recess from a remainder of a semiconductor subjacent substrate of the first type of conductivity.

16. The apparatus according to claim 13, wherein the memory device further comprises electrically conducting tracks coupling each control gate selection transistor to the control gates of the state transistors of the memory word to which the control gate selection transistor is allocated, each conducting track passing above at least one control gate selection transistor produced in the semiconductor recess housing the memory word.

17. The apparatus according to claim 13, wherein the succession of neighboring semiconductor recesses comprises an alternation of first recesses and second recesses, wherein the memory words are arranged in rows and columns in the memory plane, wherein half the memory words of a respective row form an even page and another half of the memory words of the respective row forms an odd page, wherein the even pages are produced in the first recesses and the odd pages are produced in the second recesses, and wherein the memory device is accessible page-wise.

18. The apparatus according to claim 17, wherein the first recesses are electrically mutually coupled and the second recesses are electrically mutually coupled.

19. The apparatus according to claim 13, wherein the control gate selection transistors are, in each semiconductor recess, grouped together in groups of N control gate selection transistors and are respectively allocated to N memory words belonging to one and the same semiconductor recess.

20. The apparatus according to claim 13, wherein the memory device further comprises an erasure circuit configured to erase memory cells of a selected memory word by applying an erasure voltage to the control gates of the state transistors of the memory cells of the selected memory word, via conduction terminals of the control gate selection transistor allocated to the selected memory word, and by applying, in the semiconductor recess containing the control gate selection transistor, a first compensation voltage adapted to prevent junction breakdown between the control gate selection transistor and the recess which contains the control gate selection transistor.

* * * * *